(12) United States Patent
Motooka et al.

(10) Patent No.: US 6,207,477 B1
(45) Date of Patent: Mar. 27, 2001

(54) SEMICONDUCTOR DEVICE HAVING A BALL GRID ARRAY AND A FABRICATION PROCESS THEREOF

(75) Inventors: Toshiyuki Motooka; Yoshiyuki Yoneda; Ryuji Nomoto; Toshimi Kawahara; Junichi Kasai, all of Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/021,954

(22) Filed: Feb. 11, 1998

(30) Foreign Application Priority Data

Aug. 6, 1997 (JP) .................................................. 9-212269

(51) Int. Cl.⁷ .................................................. H01L 21/44
(52) U.S. Cl. .................. 438/113; 438/110; 438/114; 438/462; 438/465; 438/613
(58) Field of Search .................................. 438/613, 460, 438/465, 113, 112, 617, 124, 127, 462, 110, 114

(56) References Cited

U.S. PATENT DOCUMENTS

| | | | |
|---|---|---|---|
| 3,855,693 | * 12/1974 | Umbaugh | 29/626 |
| 5,148,265 | 9/1992 | Khandros et al. | 357/80 |
| 5,408,127 | * 4/1995 | Mostafazadeh | 257/676 |
| 5,814,883 | * 9/1998 | Sawai et al. | 257/712 |
| 5,858,815 | * 1/1999 | Heo et al. | 438/112 |
| 5,950,070 | * 9/1999 | Razon et al. | 438/113 |

* cited by examiner

Primary Examiner—Carl Whitehead, Jr.
Assistant Examiner—Jeff Vockrodt
(74) Attorney, Agent, or Firm—Armstrong, Westrong, Westerman, Hattori, McLeland & Naughton, LLP

(57) ABSTRACT

A method of fabricating a semiconductor device includes a step of attaching a circuit substrate on a semiconductor wafer in alignment with each other, providing an electrical interconnection between the circuit substrate and semiconductor devices formed in the wafer, providing solder bumps on the circuit substrate, and dicing the semiconductor wafer together with the circuit substrate thereon along a scribe line.

9 Claims, 8 Drawing Sheets

SEMICONDUCTOR DEVICE HAVING A BALL GRID ARRAY AND A FABRICATION PROCESS THEREOF

BACKGROUND OF THE INVENTION

The present invention generally relates to semiconductor devices having a ball grid array (BGA) contact structure and more particularly to a so-called micro-BGA device in which a circuit substrate is provided on a semiconductor chip with a size smaller than an outer dimension of the semiconductor chip.

FIG. 1 shows a conventional semiconductor device having a BGA contact structure.

Referring to FIG. 1, the semiconductor device includes a circuit substrate 36 and a semiconductor chip 32 provided on a top surface of the circuit substrate 36. Further, electrodes on the semiconductor chip 32 are electrically interconnected to corresponding electrodes formed on the top surface of the circuit substrate 36 by way of a bonding wire 34. The electrodes on the top surface of the circuit substrate 36 are in turn interconnected to respective corresponding electrodes on a bottom surface of the circuit substrate 36 via through-holes (not shown) provided in the circuit substrate 36. The circuit substrate 36 further carries solder bumps 37 on the bottom surface in correspondence to the electrodes provided thereon. The semiconductor chip 32 on the top surface of the circuit substrate 36 is encapsulated by a resin package body 31 together with the bonding wire 34.

FIG. 2 shows another conventional BGA semiconductor device disclosed in the U.S. Pat. No. 5,148,265.

Referring to FIG. 2, the BGA semiconductor device is distinct over the semiconductor device of FIG. 1 in that a circuit substrate 46 corresponding to the circuit substrate 36 of FIG. 1 is now provided on a top surface of a semiconductor chip 42 corresponding to the semiconductor chip 32, with a size smaller than an outer size of the semiconductor chip 42. Such a BGA device that uses a circuit substrate having an outer size smaller than the outer size of a semiconductor chip is called a micro-BGA device. In the micro-BGA device of FIG. 2, it should be noted that the solder bumps (not shown) are provided on electrodes 43 formed on the circuit substrate 46.

In the foregoing conventional BGA device of FIG. 1, there arises a problem in that, because of the lateral size of the circuit substrate exceeding the size of the semiconductor chip, the overall size of the semiconductor device tends to become excessively large and a high-density mounting of the device on an electronic apparatus is difficult.

In the foregoing micro-BGA device of FIG. 2, on the other hand, it is necessary to bond the circuit substrate, of which size is smaller than a size of the semiconductor chip, on the semiconductor chip, while handling or alignment of such a small semiconductor chip or small circuit substrate is difficult and increases the number of fabrication steps as well as the cost of the semiconductor device.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a semiconductor device including a semiconductor chip and a circuit substrate, wherein the semiconductor device has an outer size substantially identical with an outer size of the semiconductor chip, and wherein the circuit substrate is attached to the semiconductor chip by a simple and easy process.

Another object of the present invention is to provide a method of fabricating a semiconductor device, comprising the steps of:

forming an electronic circuit on a wafer in a region defined by a scribe line, said wafer carrying a first electrode thereon;

attaching a circuit substrate carrying thereon a predetermined conductor pattern, on said wafer, said circuit substrate carrying a second electrode and a third electrode, said step of attaching said circuit substrate including a step of aligning said circuit substrate with respect to said electronic circuit in said wafer;

interconnecting said first electrode on said wafer and second electrode of said predetermined conductor pattern by a wire bonding process;

forming a spherical electrode on said third electrode; and dicing said wafer along said scribe line.

Another object of the present invention is to provide a semiconductor device, comprising:

a semiconductor chip having a top surface, said semiconductor chip carrying a first electrode;

a circuit substrate attached to a top surface of said semiconductor chip, said circuit substrate carrying thereon a predetermined conductor pattern including a second electrode and a third electrode;

a resin layer intervening between said top surface of said semiconductor chip and said circuit substrate;

a spherical electrode provided on said circuit substrate in correspondence to said third electrode;

a bonding wire electrically interconnecting said second electrode of said predetermined conductor pattern on said circuit substrate and said first electrode on said semiconductor chip; and a resin potting encapsulating said bonding wire including said first and second electrodes, said chip and said resin potting being defined by a common edge surface substantially perpendicular to a principal surface of said substrate.

Another object of the present invention is to provide a semiconductor device, comprising:

a semiconductor chip having a top surface, said semiconductor chip carrying a first electrode;

a circuit substrate attached to a top surface of said semiconductor chip, said circuit substrate carrying thereon a predetermined conductor pattern including a second electrode and a third electrode;

a spherical electrode provided on said circuit substrate in correspondence to said third electrode;

a bonding wire electrically interconnecting said second electrode of said predetermined conductor pattern on said circuit substrate and said first electrode on said semiconductor chip;

a resin potting encapsulating said bonding wire including said first and second electrodes;

a resin side wall cover covering a side wall of said circuit substrate;

said chip having a side wall substantially flush to an outer surface of said resin side wall cover, said side wall of said chip being substantially perpendicular to a principal surface of said chip.

According to the present invention, the semiconductor wafer, in which a number of semiconductor chips are formed as an integral monolithic body, is diced after the circuit substrate is attached thereto. Thereby, the adjustment for a proper positioning between the chip and the circuit substrate is achieved easily for each chip by merely conducting a positioning adjustment between the semiconductor wafer as a whole and a master circuit substrate that includes the circuit substrates with a large number in a mechanically interconnected state.

Other objects and further features of the present invention will become apparent from the following detailed description when read in conjunction with the attached drawings.

DETAILED DESCRIPTION OF THE PREFERRED EMBODIMENT

[FIRST EMBODIMENT]

Figure 1:
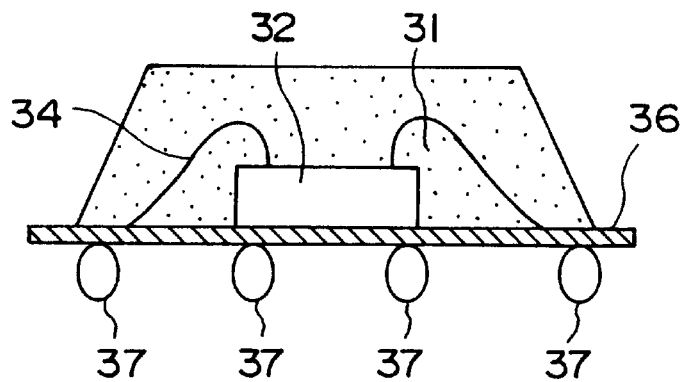
FIG. 1 is a diagram showing the construction of a conventional semiconductor device.
Figure 2:
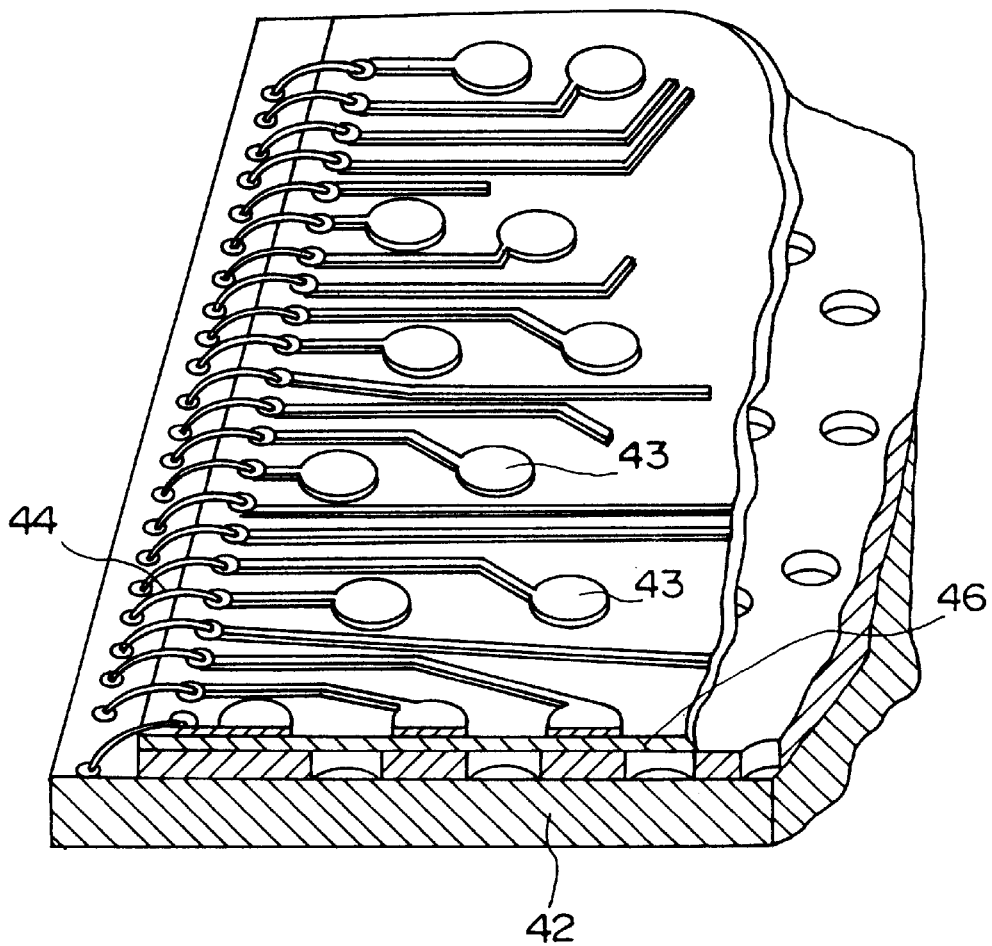
FIG. 2 is a diagram showing the construction of another conventional semiconductor device.
Figure 3:
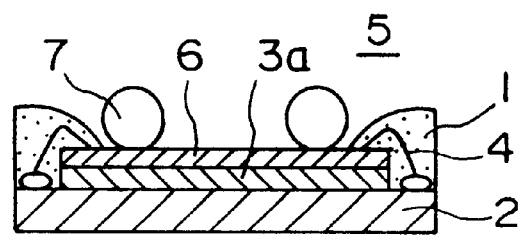
FIG. 3 is a diagram showing the construction of a semiconductor device according to a first embodiment of the present invention.
Figure 4:
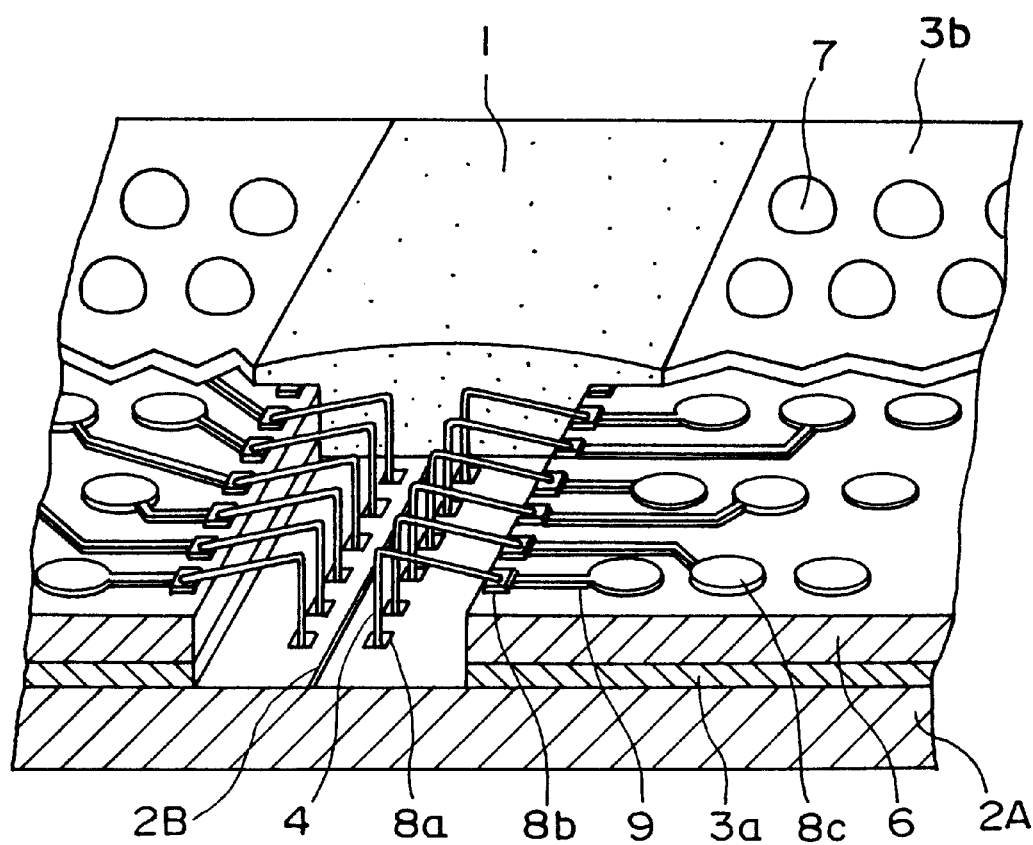
FIG. 4 is a diagram showing the construction of the semiconductor of FIG. 3 in an oblique view with a part thereof removed.

FIG. 3 shows a semiconductor device 5 according to a first embodiment of the present invention in a cross-sectional view, while FIG. 4 shows the same semiconductor device 5 formed on a semiconductor wafer 2A such as a Si wafer in an oblique view for a state before the semiconductor wafer 2A is diced into individual semiconductor chips 2 along a scribe line 2B.

Referring to FIG. 3, the semiconductor device 5 is constructed on the semiconductor chip 2 and includes a circuit substrate 6 that is provided on the semiconductor chip 2, with an intervening adhesive layer 3a that causes the circuit substrate 6 to adhere to the semiconductor chip 2 firmly. The chip 2 carries thereon an electrode pad 8a that is connected electrically to a corresponding electrode pad 8b on the circuit substrate 6 by way of a bonding wire 4. Further, the bonding wire 4 is embedded in a resin potting 1.

In the construction of the semiconductor device 5 of the present embodiment, the electrical signal appearing on the electrode pad 8a of the chip 2 is forwarded to the electrode pad 8b on the circuit substrate 6 by way of a bonding wire 4 and further to an electrode pad 8c on the circuit substrate 6 by way of a conductor pattern 9 provided on the circuit substrate 6. The electrode pad 8c carries thereon a spherical or semi-spherical solder bump 7 or a suitable spherical electrode. It should be noted that the conductor pattern 9 on the circuit substrate 6 is covered by a solder resist layer 3b, and the solder bump 7 projects outwardly from the solder resist layer 3b that covers the surface of the circuit substrate 6. It should be noted that the layer 3b is not illustrated in FIG. 3.

It should be noted that the semiconductor chip 2 is fabricated according to a standard fabrication process of an integrated circuit and supplies the output electrical signal to the electrode pad 8a provided thereon.

On the other hand, the adhesive layer 3a is formed of an adhesive material constituted by a principal resin component and a solvent that dissolves a flexibilizer. For example, a reactive thermoplastic resin that contains a carboxyl group or a denatured maleic acid anhydride may be used for the principal resin, while a reactive silicone such as a silicone having an epoxy group may be used for the flexibilizer.

More specifically, a bisphenol A-type epoxy resin may be used for a binder resin of the adhesive layer 3a in combination with a suitable amount of phenol novolak resin, which is used as a curing agent. The binder and the curing agent are then diluted by butylcellosolve acetate and mixed by a rolling process. Further, sieved Al particles having an average diameter in the range of 3–30 $\mu$m are added further to the mixture thus obtained, with a proportion such that the adhesive layer contains, in a completely cured state thereof, the Al particles with a proportion of about 30 vol %. The target adhesive is then obtained by adding triphenylphosphine further to the mixture as a cure accelerator, shortly before the end of the roll mixing process, with a proportion of about 2 wt % with respect to the 100 wt % of the epoxy resin.

The bonding wire 4, on the other hand, may be formed of a wire of gold or aluminum having a diameter of 25–30 $\mu$m and is bonded to the electrode 8a or 8b by using an ordinary wire bonding apparatus. In the present invention, a first bonding process is conducted to the electrode 8a on the chip, followed by a second bonding process that is conducted to the electrode 8b, for reducing the overall height of the semiconductor device 5.

The circuit substrate 6 is formed of a glass epoxy or polyimide and is bonded to the semiconductor chip 2 by way of the adhesive layer 3a as indicated in FIG. 3. It should be noted that the circuit substrate 6 carries thereon the conductor pattern 9, such that the conductor pattern 9, which may be formed of Cu, extends from the electrode 8b to the electrode 8c on which the solder bump 7 is formed. The conductor pattern 9 can be formed in any desired shape by conducting an etching process.

The solder bump 7 is typically formed of an alloy containing 60 wt % of Sn and 40 wt % of Pb, wherein the composition of the solder bump 7 may be adjusted appropriately depending upon the necessary or desired characteristics of the solder bump. Thus, the solder bump 7 may contain other elements than Sn or Pb. Further, the solder bump 7 may be formed by plating a solder alloy around a spherical or semi-spherical core of Cu or a resin.

FIGS. 5A–5F show the fabrication process of the BGA device 5 of FIG. 3.

Figure 5A:
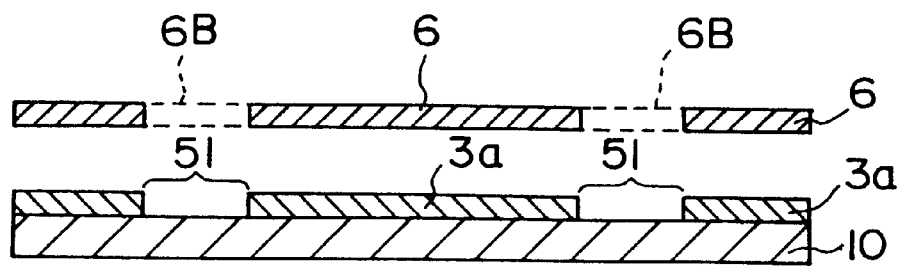
FIGS. 5A–5F are diagrams showing a fabrication process of the semiconductor device of the first embodiment.

Referring to FIG. 5A, the adhesive layer 3a is provided on a top surface of a semiconductor wafer 10, wherein the semiconductor wafer 10 includes a number of electronic devices in respective regions each defined by a scribe line 51 and corresponding to a chip, as a monolithic integral body. The adhesive layer 3a is formed by a suitable process such as a screen printing process that uses a metal mask or a screen mask. Alternatively, the adhesive layer 3a may be formed by a potting process.

Figure 5B:
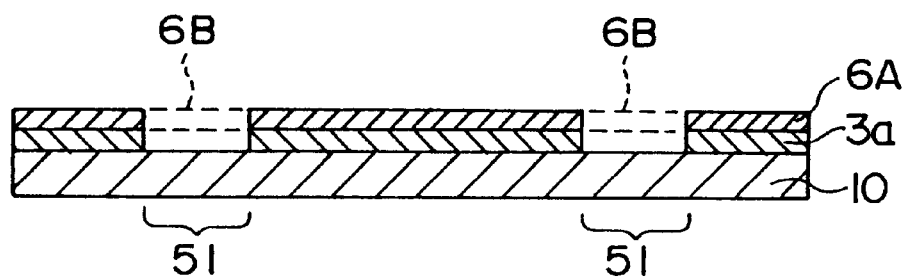

Next, in the step of FIG. 5B, a master circuit substrate 6A is mounted on the adhesive layer 3a, wherein the master circuit substrate 6A includes a number of the circuit substrates 6 in a mechanically interconnected state by a bridging part 6B. The master circuit substrate 6A is thereby adjusted with respect to the electronic devices formed on the wafer 10 such that each of the circuit substrates 6 included in the master circuit substrate 6A achieves a proper alignment to the corresponding electronic device on the wafer 10. Thereafter, the adhesive layer 3a is cured and the master circuit substrate 6A is firmly attached to the wafer 10 via the adhesive layer 3a. In the construction of FIG. 5B, it should be noted that there is formed a groove in correspondence to the scribe line 51 such that the top surface of the wafer 10 is exposed at the groove 51.

Of course, it is possible to form the master circuit substrate 6A first and attach the semiconductor wafer 10 to the circuit substrate 6A by interposing the adhesive layer 3a therebetween.

Figure 5C:
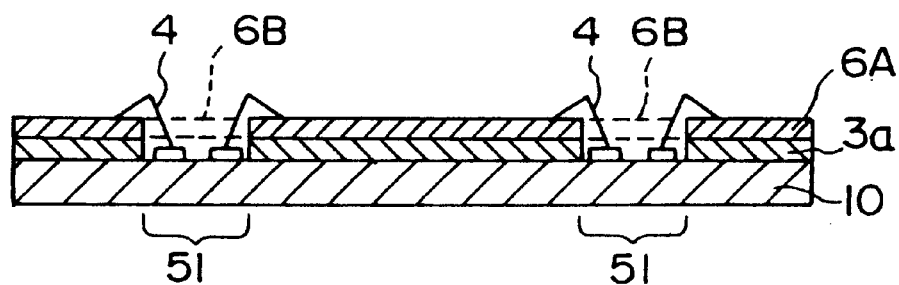

Next, in the step of FIG. 5C, the electrode pads (not shown) on the wafer 10 exposed by the groove 51 are interconnected to corresponding electrode pads on the master circuit substrate 6A by respective bonding wires 4, by conducting a wire bonding process in each of the regions of the wafer 10 and in each of the circuit substrates 6 included in the master circuit substrate 6A. Preferably, the wire bonding process of FIG. 5C is conducted first by bonding an end of the bonding wire 4 to an electrode pad on the wafer 10, followed by bonding an opposite end of the bonding wire 4 to an electrode pad on the master circuit substrate 6A. By doing so, it becomes possible to reduce the loop height of the bonding wire 4.

Figure 5D:
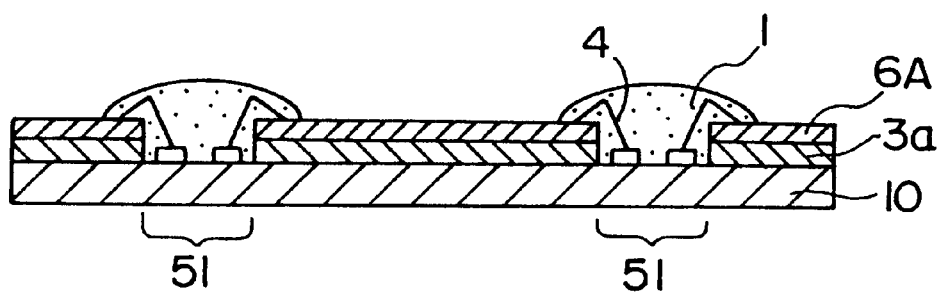
Figure 5E:
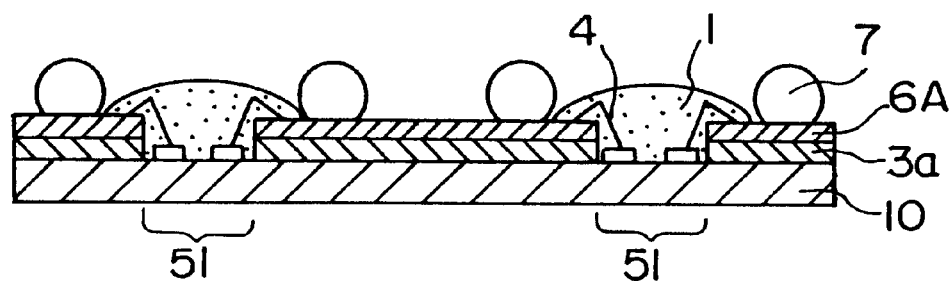

Next, in the step of FIG. 5D, the bonding wire 4 is embedded into the resin potting 1, which is provided along the scribe line 51 as indicated in FIG. 5D, and the solder bumps 7 are formed on the top surface of the master circuit substrate 6A as indicated in FIG. 5E. The solder bump 7 is formed easily by causing a reflowing of a solder ball which is placed on the electrode pad 8c shown in the oblique view of FIG. 4. By covering the solder ball by a flux layer and transferring the flux layer to the electrode pad 8c, the formation of the semi-spherical solder bump 7 is achieved successfully upon reflowing of the solder ball.

Figure 5F:
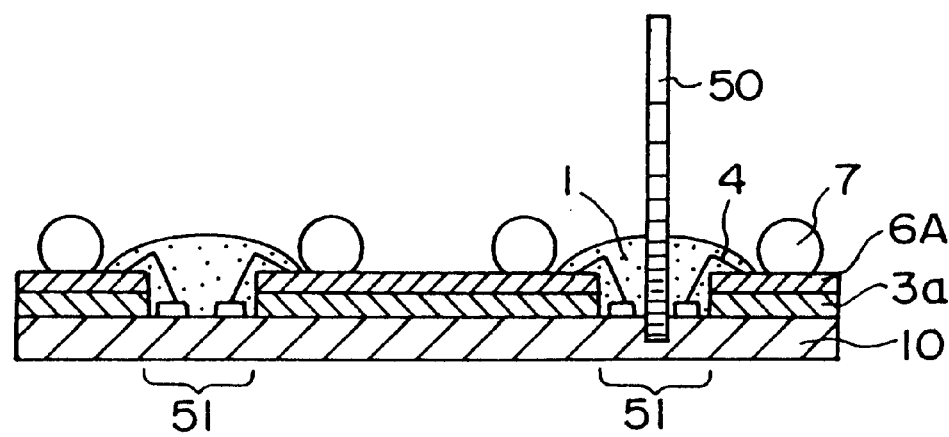

The structure thus obtained is then diced in the step of FIG. 5F by applying a dicing saw 50 along the dicing line 51, and the semiconductor device 5 of FIG. 3 is obtained. As a result of the foregoing dicing process, the semiconductor wafer 10 is divided into individual semiconductor chips 2. Similarly, the master circuit substrate 6A is divided into individual circuit substrates 6.

The semiconductor device 5 thus formed has a characteristic feature that the side wall of the semiconductor chip 2 forms a flush surface with a side wall of the resin potting 1 and that the side wall of the semiconductor chip 2 is substantially perpendicular to the principal surface of the semiconductor chip 2. Further, the foregoing fabrication process, particularly the dicing process of FIG. 5F is advantageous for avoiding the problem of chipping of the semiconductor chip, by protecting the semiconductor wafer by the resin potting 1 along the scribe line 51.

Figure 6A:
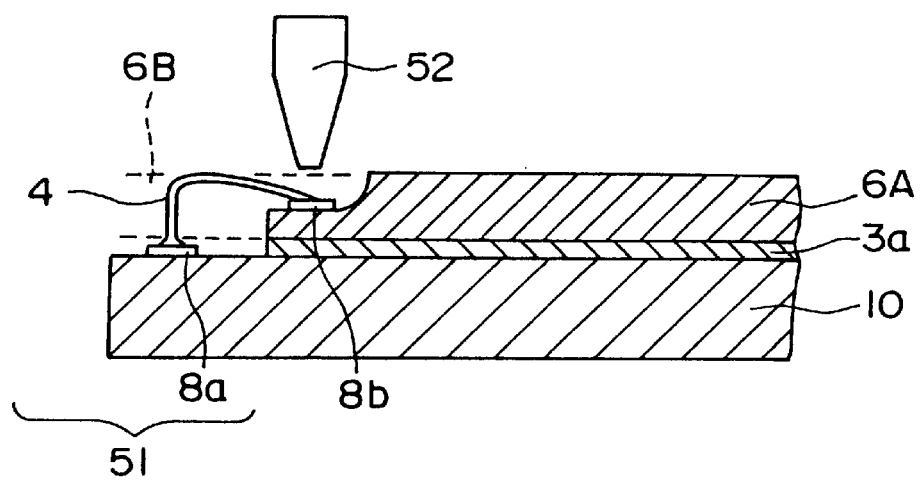
FIGS. 6A and 6B are diagrams showing a modified fabrication process of the semiconductor device of the first embodiment.

FIG. 6A shows a preferable modification of the wire bonding process of FIG. 5C conducted by a bonding tool 52, in which the master circuit substrate 6A includes a depressed region adjacent to the scribe line 51, and it can be seen that an electrode pad 8b is formed on such a depressed region. As indicated in FIG. 6A, the electrode pad 8b is connected to a corresponding electrode 8a on the wafer 10 by the bonding wire 4. The construction of FIG. 6A is advantageous for reducing the loop height of the bonding wire 4.

Figure 6B:
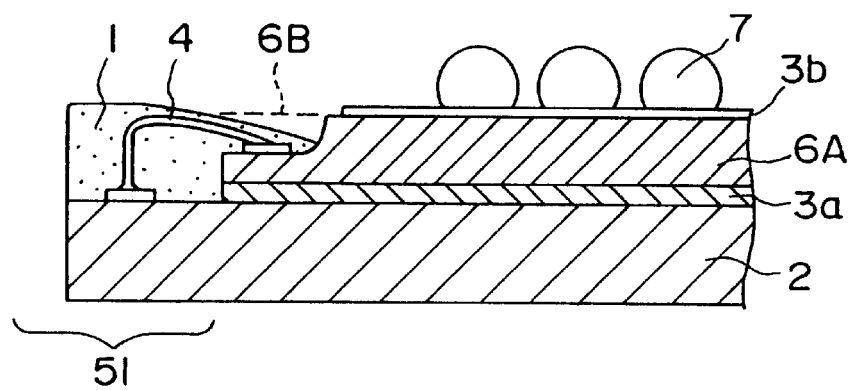

FIG. 6B shows a part of the semiconductor device that is formed from the half-product of FIG. 6A.

Referring to FIG. 6B, it can be seen that the semiconductor device has an advantageous feature in that the bonding wire 4, and hence the resin potting 1 holding the bonding wire 4 therein, is substantially accommodated in the depression formed at the edge of the circuit substrate 6A facing the scribe line 51. Thus, the risk that the solder bumps 7 on the top surface of the circuit substrate 6A failing to make a contact with an external electronic device due to the projection of the resin potting 1 is positively eliminated. Associated therewith, it should be noted that the size or diameter of the solder bumps 7 can be reduced without causing a problem of failure of contact with the external electronic device.

As already noted, the present invention as set forth above with reference to the first embodiment successfully eliminates the complex and time-consuming alignment process for achieving a proper alignment between a semiconductor chip and a corresponding minute circuit substrate, and the efficiency of production of the BGA semiconductor device is improved substantially.

[SECOND EMBODIMENT]

Figure 7:
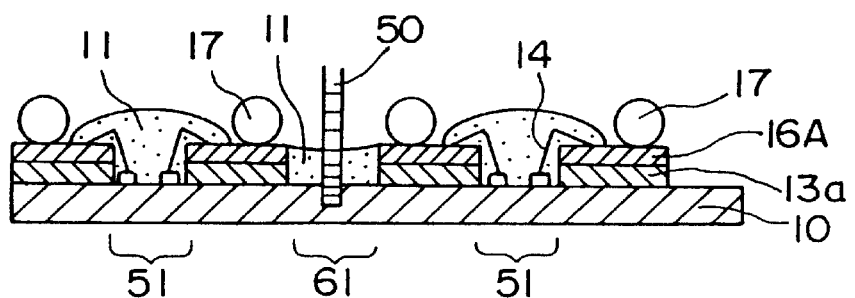
FIG. 7 is a diagram showing a fabrication process of a semiconductor device according to a second embodiment of the present invention.

FIG. 7 shows a fabrication process of a BGA semiconductor device 15 according to a second embodiment of the present invention.

Referring to FIG. 7, the semiconductor wafer 10 carries an adhesive layer 13a corresponding to the adhesive layer 3a, and a master circuit substrate 16A is provided on the adhesive layer 13a in correspondence to the master circuit substrate 6A of FIG. 5F. Further, spherical or semi-spherical solder bumps 17 are provided on the top surface of the master circuit substrate 16A in correspondence to the solder bumps 17.

In the present embodiment, the groove 51 formed in the master circuit substrate 16A and exposing the top surface of the wafer 10 is not used for the scribe line, and the electrode pads on the exposed top surface of the wafer 10 along the groove 51 are connected electrically to corresponding electrode pads on the master circuit substrate 16A by way of respective bonding wires 14. The bonding wires 14 are further embedded into a resin potting 11.

In the present embodiment, a groove 61 is formed at a location bisecting the region of the master circuit substrate 16A located between a first groove 51 and an adjacent groove 51, and the dicing is conducted along the groove 61 by applying a dicing saw to the groove 61 in a state that the groove 61 is filled by a resin potting similar to the resin potting 1.

Figure 8:
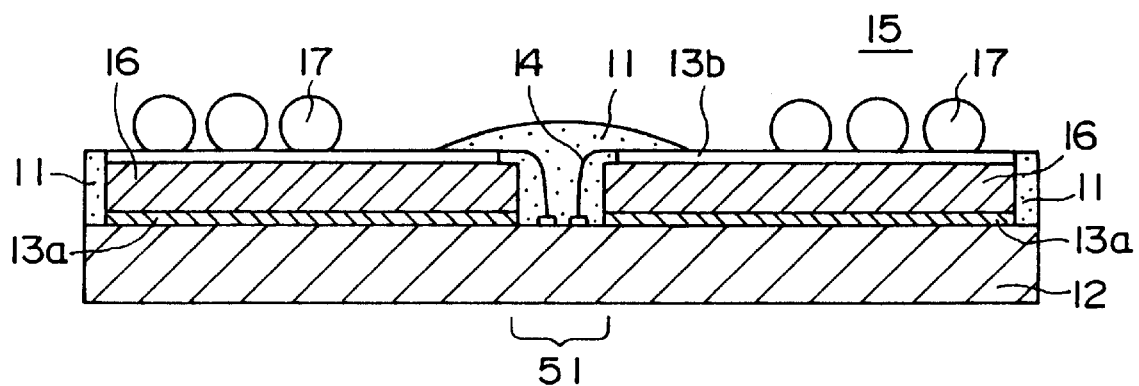
FIG. 8 is a diagram showing the semiconductor device of the second embodiment in a cross-sectional view.
Figure 9:
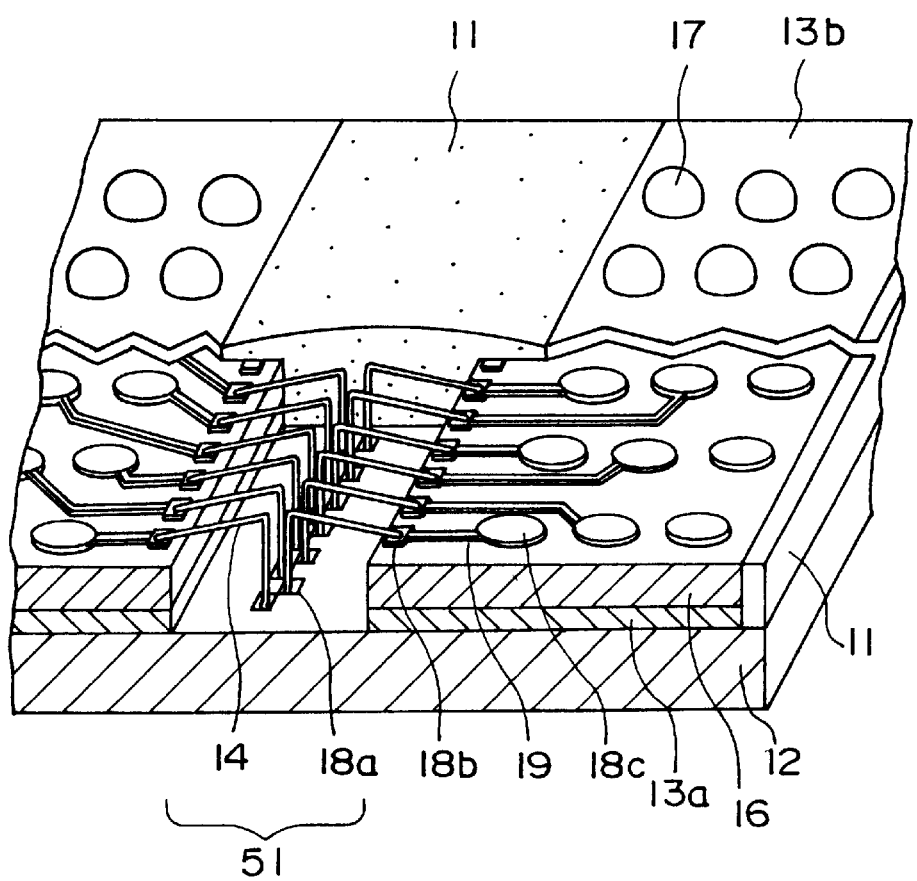
FIG. 9 is a diagram showing the semiconductor of the second embodiment in an oblique view.

FIGS. 8 and 9 show the BGA semiconductor device 15 of the present embodiment in detail respectively in a cross sectional view and in an oblique view for a state after the dicing process is conducted.

Referring to FIGS. 8 and 9, it should be noted that electrode pads 18a corresponding to the electrode pads 8a are provided on the exposed top surface of the chip 12, wherein the chip 12 is formed as a result of dicing of the wafer 10 along the scribe lines 61 of FIG. 7.

The electrode pads 18a are formed in the groove in a crisscross pattern, and each electrode pad 18a is connected to a corresponding electrode pad 18b provided on the top surface of the circuit substrate 16, which is obtained as a result of the dicing of the master circuit substrate 16A, by a bonding wire 14. The circuit substrate 16 further carries a number of conductor patterns 19 each extending between an electrode pad 18a and an electrode pad 18c, wherein the electrode pad 18c is provided on the top surface of the master circuit substrate 16A and hence on the top surface of the circuit substrate 16 in correspondence to the electrode pad 8c of FIG. 4. Further, the top surface of the circuit substrate 16 is protected by a solder resist 13b except for the part where the solder bumps 17 are formed.

In the BGA device of the present embodiment, the bonding wires 14 are used to connect the corresponding electrode pads 18a and the electrode pads 18b at a central part of the chip 12, as indicated in FIG. 8. Further, the BGA semiconductor device of the present invention is laterally surrounded by the resin potting 11.

The fabrication process of the BGA device of the present invention is substantially identical with that of the BGA device of the first embodiment, except that there is a difference in the shape of the circuit substrate 16 or in the location of the groove in which the wire bonding is made.

The present embodiment is advantageous in the point that it enables a saving of the area that is used for achieving the wire bonding process.

[THIRD EMBODIMENT]

Figure 10:
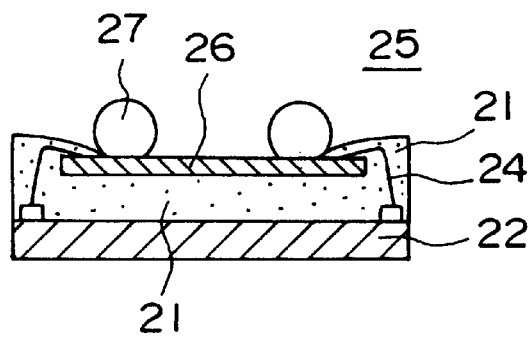
FIG. 10 is a diagram showing the construction of a semiconductor device according to a third embodiment of the present invention.

FIG. 10 shows the construction of a BGA semiconductor device 25 fabricated according to a third embodiment of the present invention.

Referring to FIG. 10, the semiconductor device 25 includes a circuit substrate 26 corresponding to the circuit substrate 6, wherein the circuit substrate 26 is formed of a polyimide film carrying thereon a conductor pattern and is mounted on a semiconductor chip 22 corresponding to the semiconductor chip 2 without an intervening adhesive layer. The conductor pattern on the polyimide film 26 may be formed by an etching process. On the polyimide film 26, there are provided a plurality of semi-spherical solder bumps 27 in correspondence to the solder bumps 7 on the circuit substrate 6. The foregoing conductor pattern on the polyimide film 26 is connected to the electrode pads on the semiconductor chip 22 by way of bonding wires 24. Further, the bonding wires 24 are embedded in a resin potting 21, wherein it should be noted that the resin potting 21 further supports the polyimide film 26 on the top surface of the semiconductor chip 22.

Hereinafter, the fabrication process of the BGA device 25 of the present invention will be described with reference to FIGS. 11A–11F.

Figure 11A:
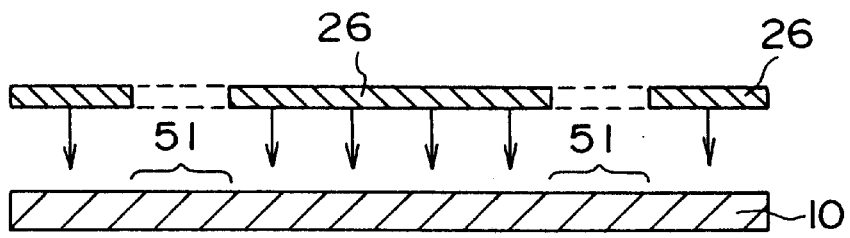
FIGS. 11A–11F are diagrams showing the fabrication process of the semiconductor device of the third embodiment.

Referring to FIG. 11A, the polyimide film 26, which carries thereon the conductor pattern, is aligned with respect to the Si wafer 10. In FIG. 11A, it should be noted that the polyimide film 26 forms a continuous film as indicated by a broken line. On the other hand, the polyimide film 26 includes a cutout in correspondence to the broken line, and the top surface of the Si wafer 10 is exposed at the foregoing cutout. It should be noted that the polyimide film 26 is disposed on the wafer 10 such that the cutout is aligned with the scribe line 51 defined in the wafer 10.

Figure 11B:
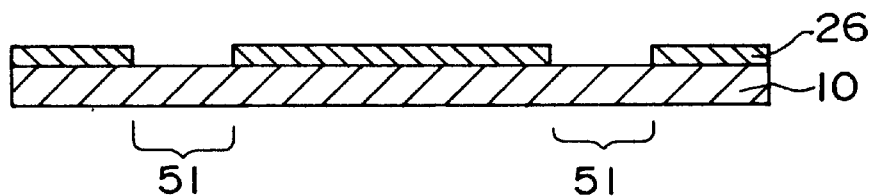
Figure 11C:
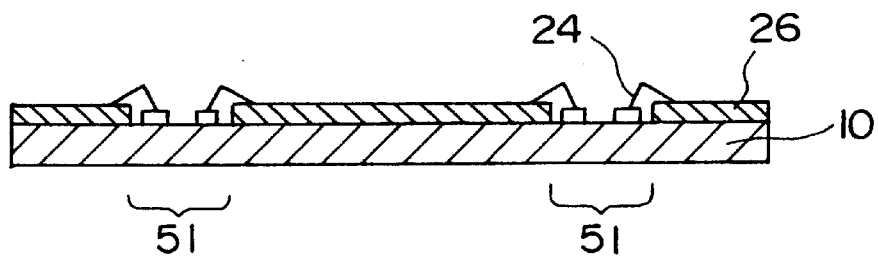

The polyimide film 26 thus aligned is then fixed temporarily on the wafer 10 by a jig such as a clip as indicated in FIG. 11B, and a wire bonding process is conducted in the step of FIG. 11C by using the bonding wire 24. Thereby, the length of the bonding wire 24 is set to be slightly larger than the length needed in the wire bonding process conducted in the state of FIG. 11C.

Figure 11D:
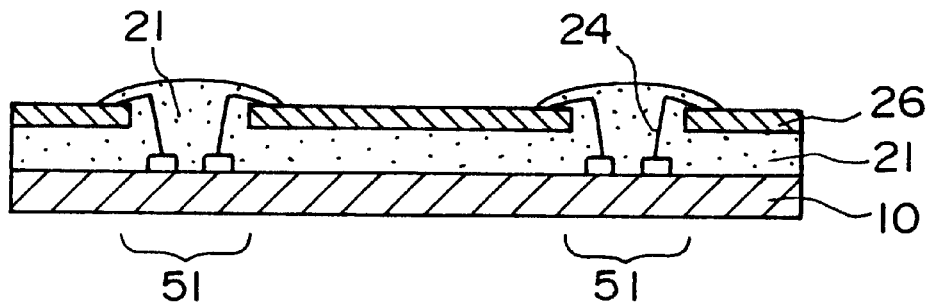

Next, an injection of the resin 21 is conducted in the step of FIG. 11D along a periphery of the wafer 10, and the polyimide film 26 is lifted in the upward direction from the wafer 10 as indicated in FIG. 11D as a result of such an injection of the resin 21. Thereby, the length of the bonding wire 24 is chosen such that the polyimide film 26 can be lifted freely in the upward direction with a predetermined distance. Such an injection of the resin 21 is easily implemented by using an apparatus that is used conventionally in the mounting process of a flip-chip package device or a BGA package device for introducing an under-fill resin between the mounting substrate and the chip or a BGA package.

Figure 11E:
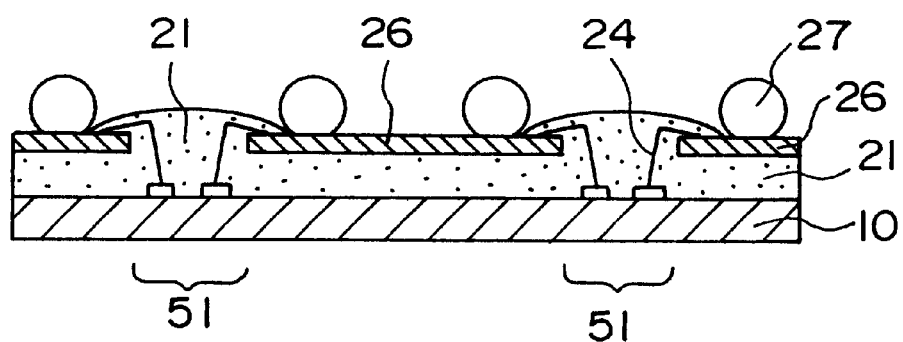
Figure 11F:
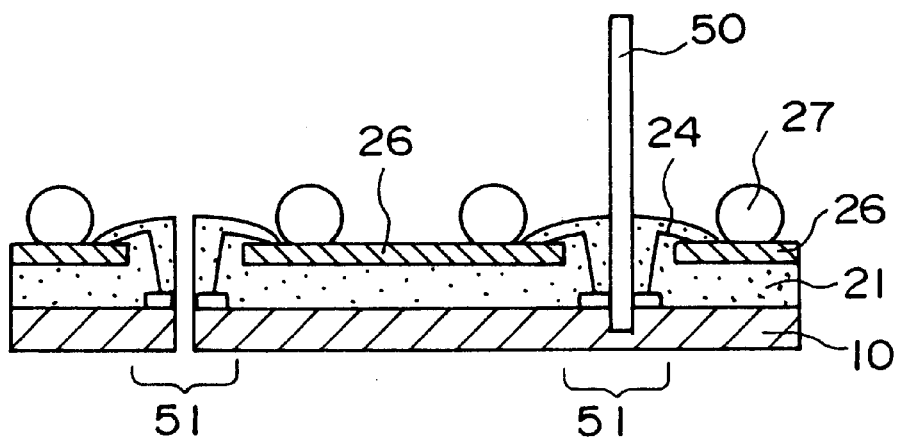

After the step of FIG. 11D, the solder bumps 27 are formed on the corresponding electrode pads of provided on the polyimide film 26 as indicated in FIG. 11E, and the structure of FIG. 11E is diced in the step of FIG. 11F along the scribe lines by applying a dicing saw 50. As a result of the dicing step of FIG. 11F, the BGA device 25 of FIG. 10 is obtained in which it should be noted that the chip 22 and the resin body 21 have a common, flush side wall perpendicular to the principal surface of the chip 22.

In the dicing step of FIG. 11F, it should be noted that the dicing of the semiconductor wafer 10 is conducted in the state that the wafer 10 is protected by the resin 21. Thus, the problem of chipping of the diced semiconductor chip 22 is effectively avoided.

In the present embodiment, too, it should be noted that the proper alignment between the individual chip 22 and the polyimide circuit substrate 26 is achieved easily, by conducting such an alignment process before the semiconductor wafer 10 is divided into individual semiconductor chips 22. Further, the present embodiment can eliminate the process of applying an adhesive film on the wafer 10.

Further, the present invention is by no means limited to the embodiments described heretofore, but various variations and modifications may be made without departing from the scope of the invention as set forth in claims.

What is claimed is:

1. A method of fabricating a semiconductor device, comprising the steps of:

forming an electrode circuit on a wafer in a region defined by a scribe line, said wafer carrying a first electrode thereon;

placing a circuit substrate carrying thereon a predetermined conductor pattern, on said wafer, said circuit substrate carrying a second electrode and a third electrode;

aligning said circuit substrate with respect to said electronic circuit in said wafer;

interconnecting said first electrode on said wafer and second electrode of said predetermined conductor pattern by a wire bonding process;

lifting said circuit substrate in a direction generally perpendicular to said wafer by introducing a resin to a space between said wafer and said circuit substrate;

forming a spherical electrode on said third electrode; and dicing said wafer along said scribe line.

2. A method as claimed in claim 1, further comprising a step of encapsulating a bonding wire used in said wire bonding step and said first and second electrodes by said resin.

3. A method as claimed in claim 2, wherein said step of dicing along said scribe line is conducted along said resin.

4. A method as claimed in claim 1, further comprising said step of providing a resin along said scribe line, and wherein said step of dicing is conducted along said resin.

5. A method as claimed in claim 1, wherein said circuit substrate is formed of a polyimide tape carrying thereon a conductor pattern.

6. A method as claimed in claim 1, wherein said circuit substrate is formed of a glass epoxy carrying a conductor pattern.

7. A method as claimed in claim 1, wherein said wire bonding process is conducted first by bonding a first end of a bonding wire to said first electrode on said wafer and subsequently by bonding a second end of said bonding wire to said second electrode on said circuit substrate.

8. A method as claimed in claim 1, wherein said spherical electrode is formed by a solder bump.

9. A method of fabricating a semiconductor device, comprising the steps of:

forming an electronic circuit on a wafer in a region defined by a scribe line, the wafer carrying a first electrode;

forming a circuit substrate having a predetermined conductor pattern including a second electrode and a third electrode, the circuit substrate further having a first opening adjacent the second electrode and a second opening different from the first opening;

providing the circuit substrate on said wafer, including placing the circuit substrate on the wafer;

aligning the first opening of the circuit substrate over the first electrode on the wafer and the second opening of the circuit substrate over the scribe line on the wafer;

interconnecting the first electrode on the wafer and the second electrode on the circuit substrate;

filling the first and second openings with a resin, including introducing the resin to a space between the wafer and the circuit substrate and lifting the circuit substrate in a direction generally perpendicular to the wafer;

forming a spherical electrode on the third electrode; and dicing the wafer along the scribe line.

* * * * *